United States Patent [19]

Kim

[11] Patent Number: 5,714,038
[45] Date of Patent: Feb. 3, 1998

[54] METHOD FOR FORMING CONTACT HOLE OF SEMICONDUCTOR DEVICE

[75] Inventor: Byeung-chul Kim, Suwon, Rep. of Korea

[73] Assignee: Samsung Electronics Co., Ltd., Suwon, Rep. of Korea

[21] Appl. No.: 652,235

[22] Filed: May 23, 1996

[30] Foreign Application Priority Data

May 24, 1995 [KR] Rep. of Korea ............... 95-13075

[51] Int. Cl.$^6$ .................................. H01L 21/00
[52] U.S. Cl. .................. 156/644.1; 156/659.11; 216/41; 437/189; 437/195
[58] Field of Search ............... 156/644.1, 659.11; 437/981, 189, 195; 216/41, 56

[56] References Cited

U.S. PATENT DOCUMENTS

| 4,707,218 | 11/1987 | Giammarco et al. ............. 156/643 |
| 5,227,014 | 7/1993 | Crotti et al. ..................... 156/644 |
| 5,409,743 | 4/1995 | Bouffard et al. ................. 427/579 |
| 5,567,270 | 10/1996 | Liu ................................. 156/644.1 |

FOREIGN PATENT DOCUMENTS 6-112151   4/1994   Japan ........................... 21/28

OTHER PUBLICATIONS

Wolf, "Silicon Processing for the VLSI Era vol. 1: Process Technology", pp. 191–194, 1986.

Wolf, "Silicon Processing for the VLSI Era Vol. 2: Process Integration", p. 121, 1990.

*Primary Examiner*—William Powell
*Attorney, Agent, or Firm*—Myers, Bigel, Sibley & Sajovec

[57] ABSTRACT

A method of forming a contact hole through an interlayer insulation layer in a semiconductor device using a sidewall spacer formed on the sidewalls of a pattern hole in a photosensitive film which serves as a mask to an anisotropic etching process used to form the contact hole.

28 Claims, 5 Drawing Sheets

METHOD FOR FORMING CONTACT HOLE OF SEMICONDUCTOR DEVICE

BACKGROUND OF THE INVENTION

The present invention relates to a method for manufacturing a semiconductor device. More particularly, the present invention relates to a method for forming a contact hole in a semiconductor device.

As semiconductor devices have become more highly integrated, contact hole diameters and the space between contact holes have decreased. Additionally, given the worsening aspect ratios in conventional semiconductor devices, the method used to form contact holes often determines the reliability of interconnections between conductive layers and defines step coverage performance. Accordingly, the method used to form contact holes should also address issues of improved step coverage in respective conductive layers.

A method of forming contact holes has previously been proposed, wherein an insulating layer in which contact holes are to be formed is isotopically etched using a wet etchant, for example, using buffered oxide etchant (BOE), and wherein the resultant structure is then anisotropically etched to form the contact holes.

FIG. 1 is a section view showing contact hole formation in a semiconductor device manufactured according to a conventional method. Here, reference numeral 10 denotes a semiconductor substrate, reference numeral 12 denotes respective impurity regions, reference numeral 14 denotes respective gate electrodes, reference numeral 16 denotes respective bit lines, reference numeral 18 denotes an interlayer insulation layer, reference numeral 20 denotes a patterned photosensitive film, and reference numeral 22 denotes respective contact holes. Impurity regions 12 are selectively formed in semiconductor substrate 10. Gate electrodes 14 and bit lines 16 are formed over regions between impurity regions 12. Interlayer insulation layer 18 insulates gate electrodes 14 and bit lines 16 from other conductive layers (not shown).

Each contact hole 22 formed in interlayer insulation layer 18 exposes an impurity region 12. Contact holes 22 are formed by a method comprising the three steps of: (a) forming a patterned photosensitive film 20 on interlayer insulation layer 18 having a contact hole pattern corresponding to the location of a respective impurity region 12; (b) isotopically etching interlayer insulation layer 18 with a wet etchant, for example, BOE, using photosensitive film 20 as an etching mask; and (c) anisotropically etching interlayer insulation layer 18.

The foregoing conventional method of forming a contact hole is easy to perform and has the effect of improving aspect ratio. Thus, the method enjoys wide use. However, the method has certain drawbacks.

First, if the isotropic etching step is performed for a duration sufficient to improve step coverage characteristics of a conductive layer, such duration may also result in the undesired etching of one or more interlayer insulation layers, both vertically and horizontally. In this circumstance, a portion of the photosensitive film 20 employed as an etching mask may lift, and an underlying portion of the conductive layer, e.g., a portion of bit line 16, may become exposed. See, for example, area "C" of FIG. 1.

Second, a narrow ridge may be formed between the adjacent contact holes by the excessive isotropic etching. See area "A" of FIG. 1. This undesired ridge increases the potential for shorting between conductive lines.

Third, peaks or transitional discontinuities in the contact hole structure are formed. See, areas "B" and "C" of FIG. 1. Such peaks degrade step coverage.

Fourth, since the above-described isotropic etching generally has a high etching ratio, it is hard to form contact holes having a specific, desired size.

SUMMARY OF THE INVENTION

The present invention provides a method of forming contact holes in a semiconductor device which substantially alleviates the problems arising from the above-described conventional method.

In one aspect, the present invention provides a method of forming a contact hole in a semiconductor device comprising the steps of forming an interlayer insulation layer over a semiconductor substrate and then forming a photosensitive film over the interlayer insulation layer to selectively expose a portion of the interlayer insulation layer in which a contact hole is to be formed through a pattern hole in the photosensitive film. Once the photosensitive film is in place a first material layer is formed over it.

The first material layer is anisotropically etched to form a sidewall spacer on sidewalls of the pattern hole in the photosensitive film. Thereafter, the sidewall spacer and the interlayer insulation layer are anisotropically etched using the photosensitive film as an etching mask to form a contact hole through the interlayer insulation layer.

As presently preferred, the two anisotropic etching steps are sequentially performed in the same process chamber. Furthermore, the interlayer insulation layer may be thinned and planarized before formation of the photosensitive film.

The interlayer insulation layer and the first material layer may be formed from one or more materials having the same etching rate with respect to the anisotropic etching process.

The contact hole may be finished by forming a barrier metal layer over the structure resulting from the two anisotropic etching steps and by forming a conductive layer over the barrier layer.

In another aspect, the method of forming a contact hole in a semiconductor device according to the present invention adds an additional material layer between the interlayer insulation layer and the photosensitive film.

In yet another aspect, the method of forming a contact hole in a semiconductor device accordingly to the present invention comprises the steps of forming an interlayer insulation layer over a semiconductor substrate, forming a first material layer over the interlayer insulation layer, forming a photosensitive film over the first material layer to selectively expose a portion of the first material layer in which a contact hole is to be formed through a pattern hole in the photosensitive film, anisotropically etching the first material layer and the interlayer insulation layer using the photosensitive film as an etching mask to form a groove through the exposed portion the first material layer and partially through a portion of the interlayer insulation layer underlying the exposed portion of the first material layer, removing the photosensitive film following formation of the groove, forming a second material layer over the structure resulting from foregoing step, anisotropically etching the second material layer to form a sidewall spacer on sidewalls of the groove, and anisotropically etching the sidewall spacer, first material layer, and interlayer insulation layer to remove the first material layer and sidewall spacer and to form a contact hole through the interlayer insulation layer.

It is desirable for the interlayer insulation layer and the first material layer to be formed of a material having the same etching ratio as that of the material used for the anisotropic etching. It is further desirable that the interlayer insulation layer be formed of BPSG or $O_3$—TEOS, and that the first material film be formed of a low-temperature-deposited oxide film. Here, it is particularly desirable that the BPSG be deposited and then annealed at a temperature of 800°–900° C. in a nitrogen atmosphere.

In each of these aspects, the method of forming a contact hole as defined by the present invention provides enhanced step coverage in the final conductive layer, and prevents lifting of the photosensitive film. As a result, exposure of the lower conductive layer is suppressed and the size of the contact hole can be easily controlled.

BRIEF DESCRIPTION OF THE DRAWINGS

The above results and other advantages of the present invention will become more apparent upon consideration of a preferred embodiment thereof with reference to the attached drawings in which.

DETAILED DESCRIPTION OF THE INVENTION

A method of forming a contact hole in a semiconductor device according to a first embodiment of the present invention will be explained with reference to FIGS. 2A through 2D.

Figure 1:
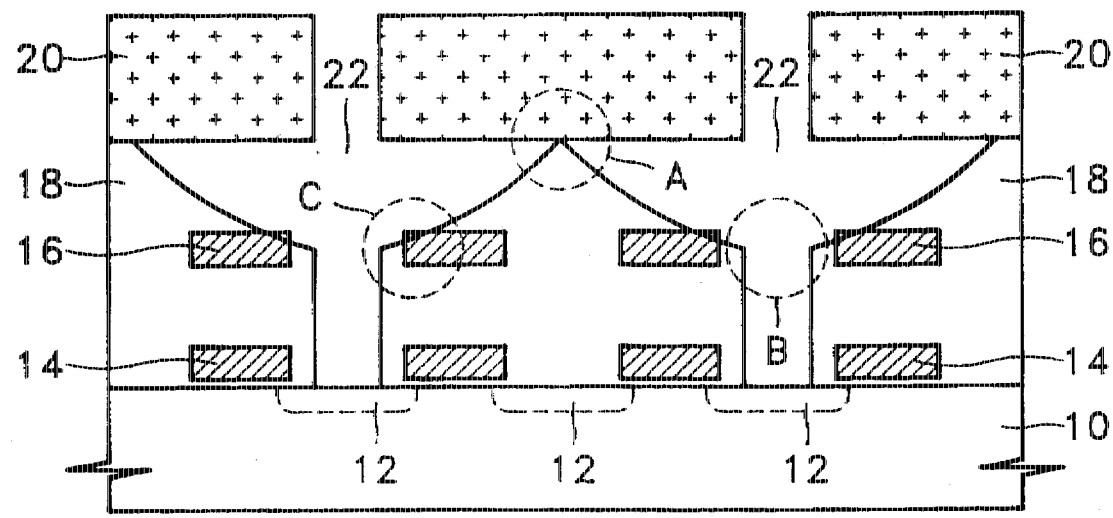
FIG. 1 is a section view showing a contact hole of a semiconductor device manufactured by a conventional method.
Figure 2A:
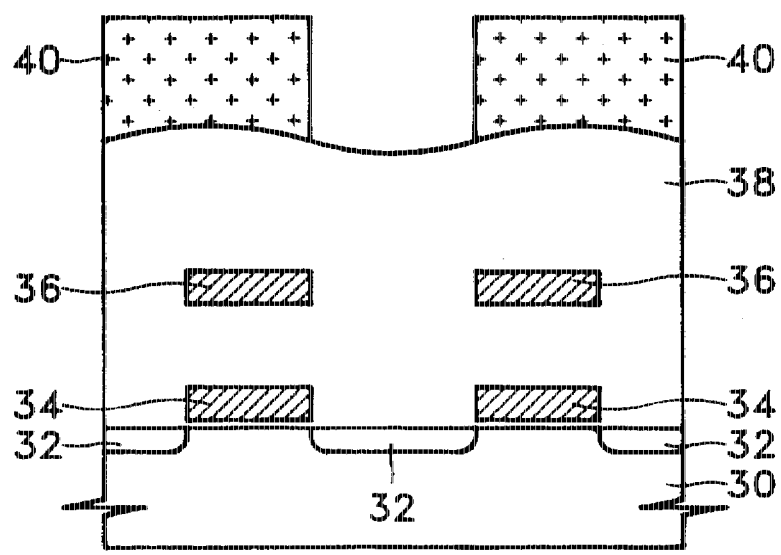
FIGS. 2A to 2D are section views sequentially illustrating the steps of a method for forming a contact hole of a semiconductor device according to a first embodiment of the present invention.

FIG. 2A shows the formation of an interlayer insulation layer 38 and a photosensitive film pattern 40. Prior to the formation of interlayer insulation layer 38, impurity regions 32 are selectively formed in semiconductor substrate 30. Thereafter, interlayer insulation layer 38 is formed over the surface of substrate 30. The photosensitive film 40 is formed over interlayer insulation layer 38 having a pattern defining the subsequently formed contact holes. Thus, the "pattern" of the photosensitive film selectively exposes portions of interlayer insulation layer 38 in which a contact hole is to be formed. Underlying conductive layers, from which gate electrodes 34 and bit lines 36 are formed, can be added before or after the formation of impurity regions 32 according to conventional practice.

It is desirable to planarize the upper surface of interlayer insulation layer 38. This can be accomplished by chemical-mechanical polishing, for example. Additionally, in order to lower the aspect ratio of the subsequently formed contact holes, it is desirable to thin interlayer insulation layer 38 using an etch back process.

Interlayer insulation layer 38 is preferably formed by depositing an oxide material, for example, boro-phosphorous silicate glass (BPSG) or ozon-tetraethylorthosilicate ($O_3$—TEOS), to a thickness of 6,000 Å to 12,000 Å. If BPSG is used, an annealing process is performed at a temperature of from 700° C. to 950° C. following deposition of the BPSG, to thereby planarize the surface of the interlayer insulation layer. Photosensitive film 40 is formed of a photosensitive material, for example, a photoresist.

Figure 2B:
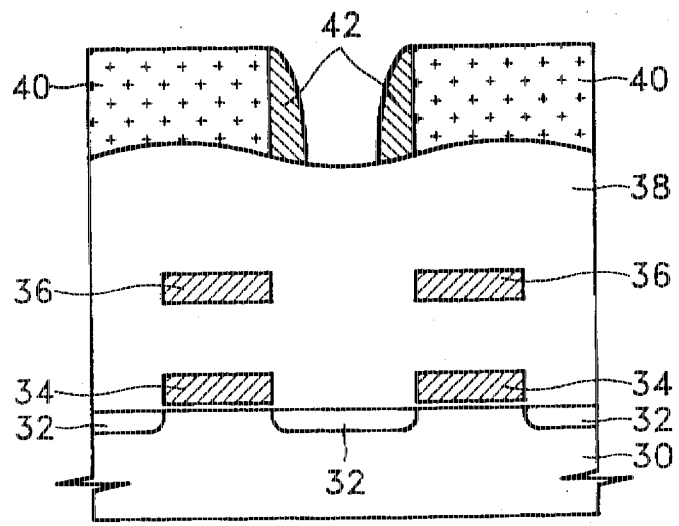

FIG. 2B shows the formation of sidewall spacer First, a first material layer (not shown) having the same etching rate as that of the material constituting interlayer insulation layer 38 with respect to a predetermined anisotropic etching method, generally a poor etching selectivity, is deposited over photosensitive film pattern 40. Next, the first material layer is anisotropic etched to form sidewall spacer 42 on the sidewalls of a contact hole pattern defined by photosensitive film 40. Otherwise, the first material layer is typically removed in its entirety from the surface of photosensitive film pattern 40. The first material layer is preferably an oxide film formed by a low-temperature deposition to a thickness of 1,000 Å to 3,000 Å. "Low-temperature" and "high-temperature" depositions of an oxide film are relative terms understood by those of ordinary skill in the art.

Figure 2C:
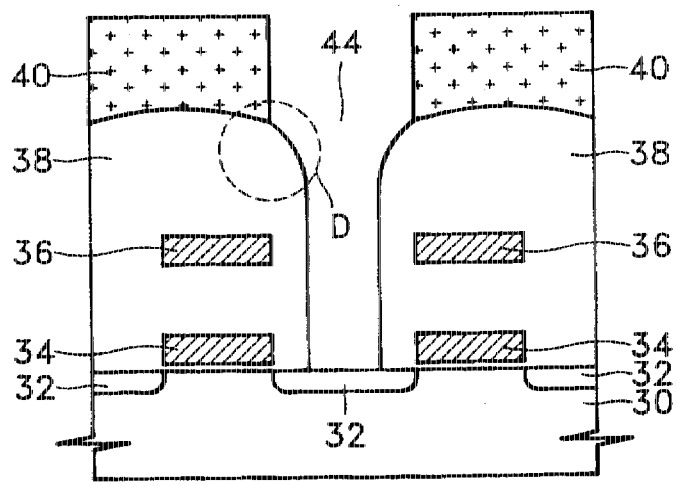

FIG. 2C shows the formation of a contact hole 44. The contact hole 44 is formed by anisotropically etching sidewall spacer 42 and interlayer insulation layer 38 using photosensitive film 40 as an etching mask. As noted above, interlayer insulation layer 38 and sidewall spacer 42 are formed of material having the same etching rate. Thus, as sidewall spacer 42 and interlayer insulation layer 38 are simultaneously etched, an upper portion of contact hole 44 is formed having a smooth, convex shoulder. See, area "D" in FIG. 2C, for example. The steps of forming sidewall spacer in FIG. 2B and the steps of forming contact hole 44 in FIG. 2C may be sequentially performed in the same chamber.

Figure 2D:
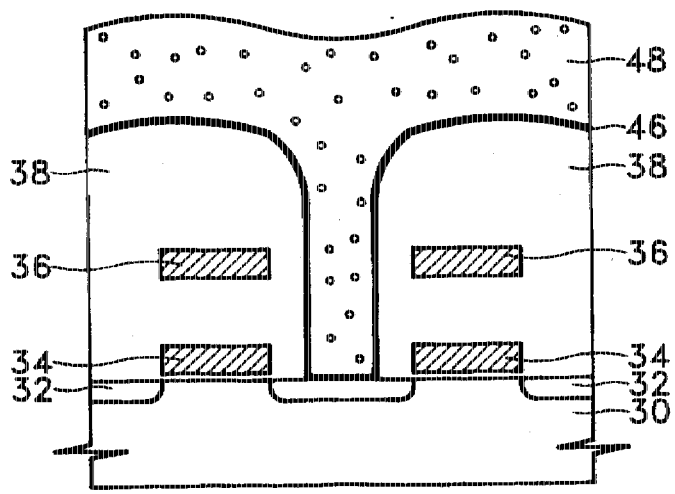

FIG. 2D shows the formation of a barrier layer 46 and a conductive layer 48. First, photosensitive film 40 of FIG. 2C is removed. Next, barrier metal layer 46 is formed over the resultant structure. Finally, conductive layer 48 (a metal wiring layer) is formed over barrier metal layer 46.

Barrier metal layer 46 is preferably formed by depositing titanium-titanium nitride (Ti—TiN) to a thickness of 300 Å to 1,000 Å. Conductive layer 48 is preferably formed by depositing a metal or metal alloy material of tungsten (W) or aluminum (Al), for example.

It will be noted that no "peak" or transitional discontinuity is formed within the contact hole structure as in the conventional method. Rather, the smooth shoulder of the contact hole formed according to the method of the present invention precludes step coverage flaws and the resulting electrical disconnects in conductive layer 48.

Figure 3A:
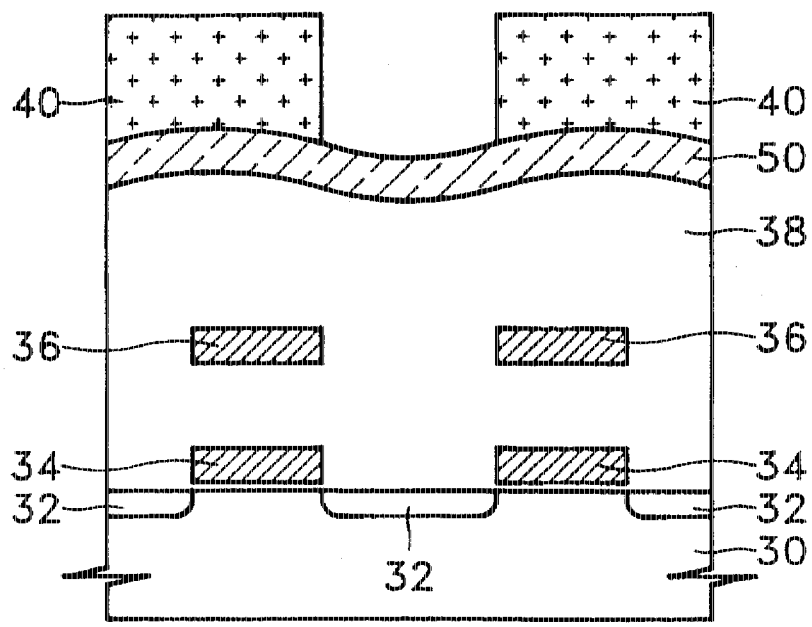
FIGS. 3A and 3B are section views sequentially illustrating the steps of a method for forming a contact hole of a semiconductor device according to a second embodiment of the present invention.
Figure 3B:
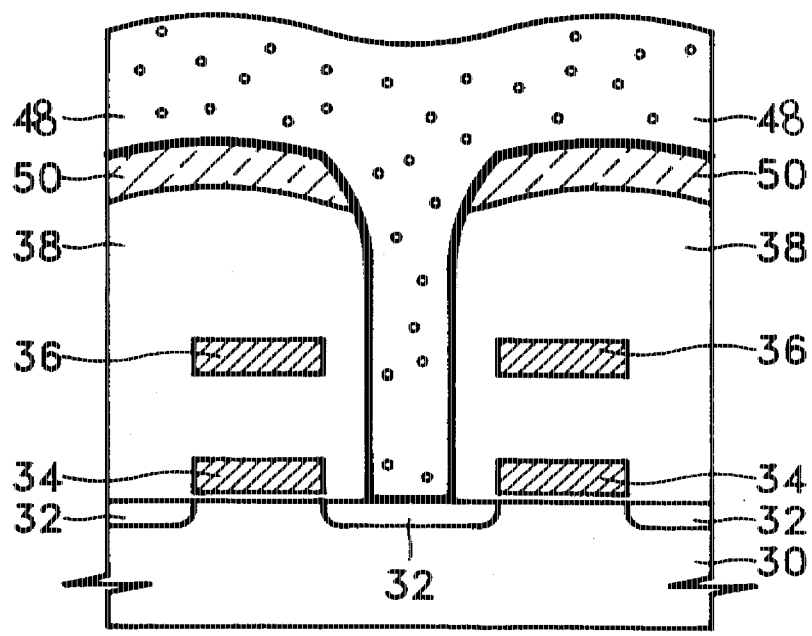

A method of forming a contact hole in a semiconductor device according to a second embodiment of the present invention will be explained with reference to FIGS. 3A and 3B.

The second embodiment differs from the first embodiment in that the second embodiment further comprises a step of forming an additional material layer 50 comprising a material having an etching rate the same as the etching rate for interlayer insulation layer 38 with respect to a predetermined anisotropic etching, between interlayer insulation layer 38 and photosensitive film pattern 40.

As described with respect to the second embodiment of the present invention, the additional material layer 50 is referred to as the "first" material layer according to its order of formation. The subsequent material layer used to form the sidewall spacer, as described above with respect to the first embodiment, is referred to as the "second" material layer.

The steps through the formation of interlayer insulation layer 38 are the same as those described with respect to the first embodiment. Thereafter, first material layer 50 is formed over interlayer insulation layer 38. Then, photosensitive film 40 is formed in the same manner as that of the first embodiment. See FIG. 3A.

A sidewall spacer (reference numeral "42"0 of FIG. 2B) is formed by the same steps described with respect to the first embodiment, but these steps are applied to the "second" material formed in this embodiment. Thereafter, the sidewall spacer, first material layer 50 and interlayer insulation layer 38 are anisotropically etched to form a contact hole. The remaining steps in the second embodiment thereafter coincide with those of the first embodiment. See FIG. 3B.

It is desirable that interlayer insulation layer 38 and first and second material layers are formed of a material having the same etching rate with respect to a predetermined anisotropic etching. In the second embodiment, interlayer insulation layer 38 and the second material layer are formed of the materials previously described. The first material layer 50 is preferably formed by depositing an insulating material, for example, a plasma-enhanced TEOS or a silicon nitride, to a thickness of 1,000 Å to 3,000 Å.

In the first and second embodiments, instead of photosensitive film 40, a mask pattern formed of a material having a different etching rate (i.e., an excellent etching selectivity) from that of the material constituting interlayer insulation layer 38 and the first and second material layers with respect to a predetermined anisotropic etching can be employed. If the mask pattern is formed of a polysilicon, for example, the second material layer may be formed from an oxide film deposited at either low-temperature or high-temperature.

A method of forming a contact hole in a semiconductor device according to a third embodiment of the present invention will be explained with reference to FIGS. 4A through 4E.

Figure 4A:
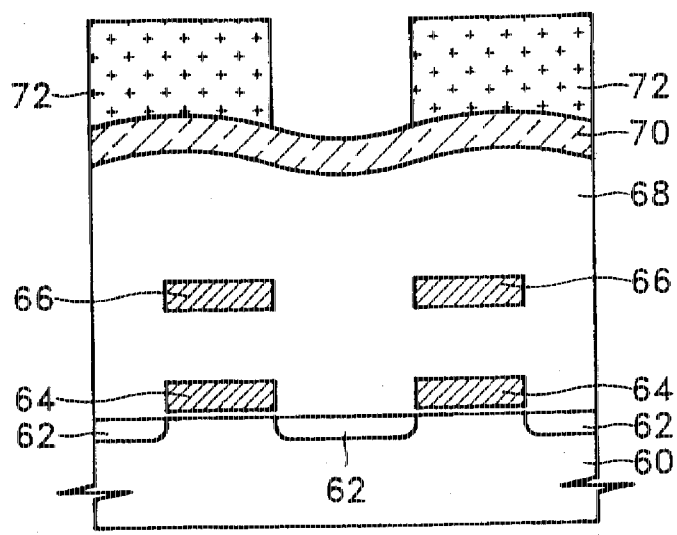
FIGS. 4A to 4E are section views sequentially illustrating the steps of a method for forming a contact hole of a semiconductor device according to a third embodiment of the present invention.

FIG. 4A shows the formation a first material layer 70 and a photosensitive film pattern 72. To begin with, impurity regions 62 are selectively formed in semiconductor substrate 60. Next, an interlayer insulation layer 68 is formed over the surface of the semiconductor substrate 60. First material layer 70 is then formed over interlayer insulation layer 68. Thereafter, photosensitive film pattern 72 is formed on first material layer 70. Photosensitive film 72 is used to selectively expose portions of interlayer insulation layer 68 wherein a contact hole is to be formed.

First material layer 70 is formed of a material having the same etching rate (i.e., poor etching selectivity) as that of the material constituting interlayer insulation layer 68, with respect to a predetermined anisotropic etching. In the third embodiment of the present invention, an oxide film or a nitride film may be employed as the material forming first material layer 70. Interlayer insulation layer 68 and photosensitive film pattern 72 are formed of materials described with respect to the first embodiment.

Figure 4B:
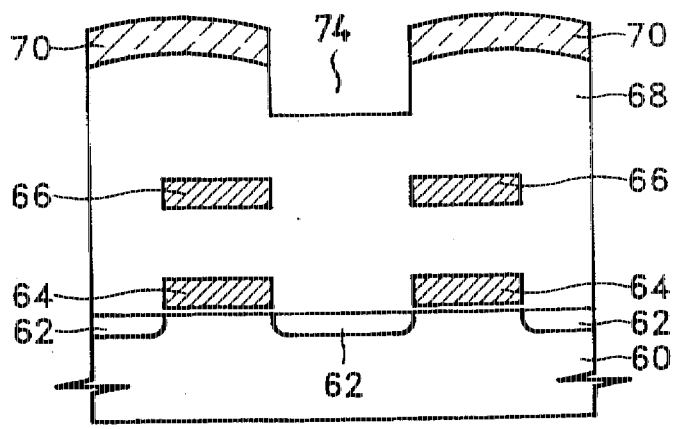

The etch-back process and planarization process which are performed in the first embodiment in order to reduce the thickness of the interlayer insulation layer are not necessary in the present embodiment FIG. 4B shows the formation of groove 74. To begin, the first material layer 70 and interlayer insulation layer 68 are etched using photosensitive film pattern 72 of FIG. 4A. Thereafter, photosensitive film pattern 72 is eliminated. Groove 74 exposes to a predetermined depth a portion of interlayer insulation layer 68 in which a contact hole is to be formed.

Figure 4C:
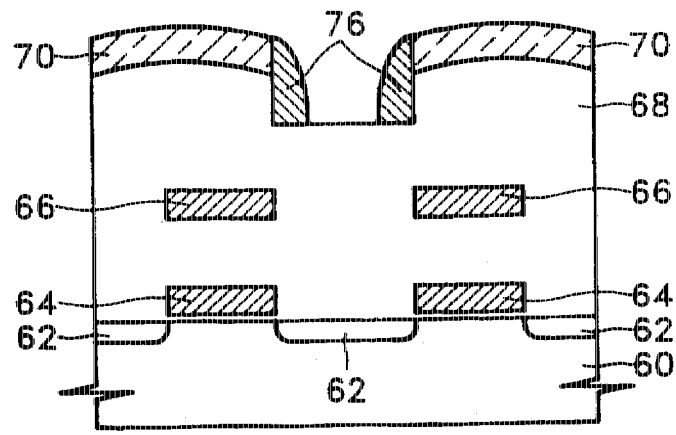

FIG. 4C shows the formation of sidewall spacers 76. After eliminating the photosensitive film pattern, a second material layer is formed over the structure resulting from the formation of groove 74. Anisotropic etching of the second material layer is then performed to produce sidewall spacer 76 on the sidewalls of groove 74.

It is desirable that the second material layer is formed of a material having the same etching rate (i.e., poor etching selectivity) as that of the material constituting first material film 70 and interlayer insulation layer 68, with respect to a predetermined anisotropic etching. In the third embodiment of the present invention, the second material layer is formed by depositing an insulating material, for example, an oxide film or a nitride film, to a thickness of 1,000 Å to 3,000 Å.

Figure 4D:
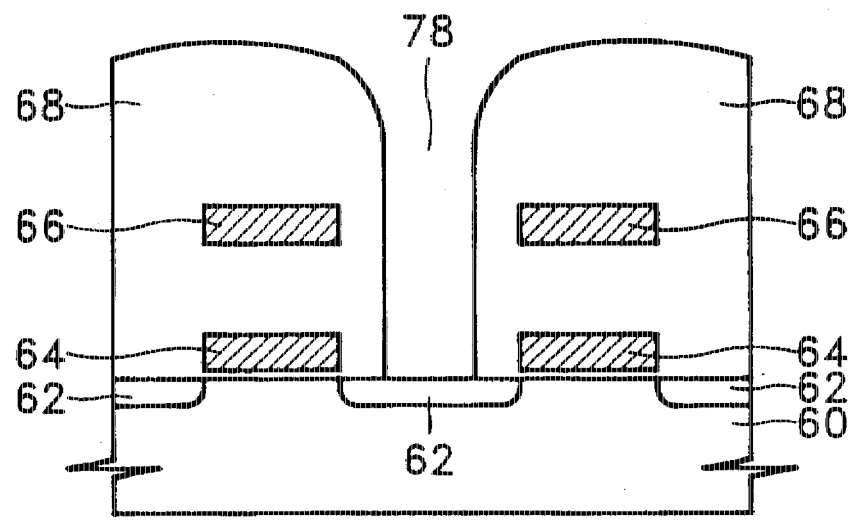

FIG. 4D shows the formation of a contact hole 78. The step is performing by anisotropic etching first material film 70, sidewall spacer 76, and interlayer insulation layer 68 of FIG. 4C. The anisotropic etching continues until semiconductor substrate 60 is exposed. The etching process for forming the sidewall spacer 76 of FIG. 4C and the etching process for forming the contact hole of FIG. 4D can be sequentially formed in the same process chamber.

Figure 4E:
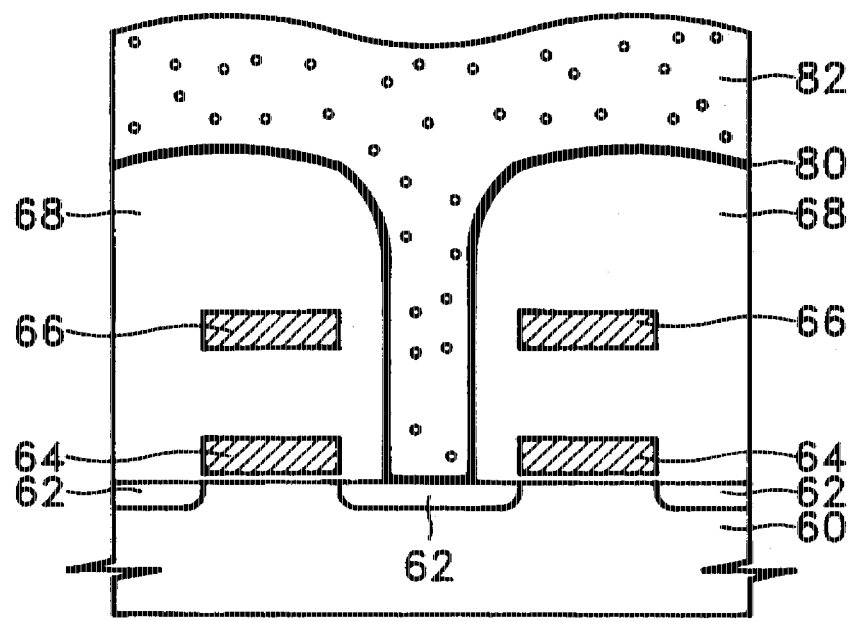

FIG. 4E shows the formation of a barrier metal layer 80 and a conductive layer 82. The steps to form these elements are the same as those previously described with respect to the first embodiment.

According to the method of forming a contact hole in a semiconductor device according to the first embodiment of the present invention, isotropic etching using BOE is not necessary. Thus, three improvements are achieved. First, no portion of the photosensitive film pattern is lifted to expose a portion of a lower conductive layer. This result compares quite favorably with the results often occurring when excessive isotropic etching occurs. Second, since no peak is formed within the contact hole structures and no ridge is formed between the adjacent contact holes, disconnections of conductive layers and step coverage degradation can both be prevented. Third, since the size of the contact hole is controlled by a photosensitive film pattern, easy formation of a contact hole having the desired size is enabled.

The foregoing description is given by way of example. Various changes and modifications may be made to the preferred embodiments described above without departing from the spirit and scope of the present invention which is defined by the following claims.

What is claimed is:

1. A method of forming a contact hole in a semiconductor device, comprising the steps of:

(a) forming an interlayer insulation layer over a semiconductor substrate;

(b) forming a photosensitive film over the interlayer insulation layer to selectively expose a portion of the interlayer insulation layer in which a contact hole is to be formed through a pattern hole in the photosensitive film;

(c) forming a first material layer over the photosensitive film;

(d) anisotropically etching the first material layer to form a sidewall spacer on sidewalls of the pattern hole in the photosensitive film; and (e) anisotropically etching the sidewall spacer and the interlayer insulation layer using the photosensitive film as an etching mask to form a contact hole through the interlayer insulation layer;

wherein steps (d) and (e) are sequentially performed in the same process chamber.

2. The method of forming a contact hole in a semiconductor device according to claim 1, further comprising the step of:

thinning the interlayer insulation layer before step (b).

3. The method of forming a contact hole in a semiconductor device according to claim 1, further comprising the step of:

planarizing the interlayer insulation layer before step (b).

4. The method of forming a contact hole in a semiconductor device according to claim 1, wherein the interlayer insulation layer and the first material layer are formed from at least one material having the same etching rate with respect to the anisotropic etching performed in step (e).

5. The method of forming a contact hole in a semiconductor device according to claim 4, wherein the interlayer insulation layer is formed from a material selected from a group consisting of BPSG and $O_3$—TEOS.

6. The method of forming a contact hole in a semiconductor device according to claim 5, wherein the material selected is BPSG, and step (a) comprises the substeps of:

depositing a BPSG layer over the semiconductor substrate; and, annealing the BPSG layer at a temperature in a range of from 800° to 900° C. in a nitrogen atmosphere.

7. The method of forming a contact hole in a semiconductor device according to claim 4, wherein the first material layer comprises an oxide film.

8. The method of forming a contact hole in a semiconductor device according to claim 1, further comprising the steps of:

(f) forming a barrier metal layer over the structure resulting from step (e); and, (g) forming a conductive layer over the structure resulting from step (f).

9. A method of forming a contact hole in a semiconductor device comprising the steps of:

(a) forming an interlayer insulation layer over a semiconductor substrate;

(b) forming a first material layer over the interlayer insulation layer;

(c) forming a photosensitive film over the first material layer to selectively expose a portion of the first material layer in which a contact hole is to be formed through a pattern hole in the photosensitive film;

(d) forming a second material layer over the photosensitive film;

(e) anisotropically etching the second material layer to form a sidewall spacer on sidewalls of the pattern hole in the photosensitive film; and (f) anisotropically etching the sidewall spacer, first material layer, and interlayer insulation layer using the photosensitive film as an etching mask to form a contact hole through the first material layer and the interlayer insulation layer.

10. The method of forming a contact hole in a semiconductor device according to claim 9, wherein steps (e) and (f) are sequentially performed in the same process chamber.

11. The method of forming a contact hole in a semiconductor device according to claim 9, wherein the interlayer insulation layer, first material layer, and second material layer are formed from at least one material having the same etching rate with respect to the anisotropic etching performed in step (f).

12. The method of forming a contact hole in a semiconductor device according to claim 11, wherein the interlayer insulation layer and second material layer are formed from a material selected from a group consisting of BPSG and $O_3$—TEOS.

13. The method of forming a contact hole in a semiconductor device according to claim 12, wherein the first material layer is formed from a material selected from a group consisting of silicon nitride and PE-TEOS.

14. The method of forming a contact hole in a semiconductor device according to claim 9, further comprising the steps of:

(g) forming a barrier metal layer over the structure resulting from step (f); and, (h) forming a conductive layer over the structure resulting from step (g).

15. A method of forming a contact hole in a semiconductor device comprising the steps of:

(a) forming an interlayer insulation layer over a semiconductor substrate;

(b) forming a first material layer over the interlayer insulation layer;

(c) forming a photosensitive film over the first material layer to selectively expose a portion of the first material layer in which a contact hole is to be formed through a pattern hole in the photosensitive film;

(d) anisotropically etching the first material layer and the interlayer insulation layer using the photosensitive film as an etching mask to form a groove through the exposed portion the first material layer and partially through a portion of the interlayer insulation layer underlying the exposed portion of the first material layer;

(e) removing the photosensitive film following formation of the groove;

(f) forming a second material layer over the structure resulting from step (e);

(g) anisotropically etching the second material layer to form a sidewall spacer on sidewalls of the groove; and, (h) anisotropically etching the sidewall spacer, first material layer, and interlayer insulation layer to remove the first material layer and sidewall spacer and to form a contact hole through the interlayer insulation layer.

16. The method of forming a contact hole in a semiconductor device according to claim 15, wherein said steps (g) and (h) are sequentially performed in the same process chamber.

17. The method of forming a contact hole in a semiconductor device according to claim 15, wherein the interlayer insulation layer and first and second material layers are formed from at least one material having the same etching rate with respect to the anisotropic etching performed in step (h).

18. A method for forming a contact hole of a semiconductor device according to claim 15, wherein the interlayer insulation layer is formed from a material selected from a group consisting of BPSG and $O_3$—TEOS.

19. A method for forming a contact hole of a semiconductor device according to claim 18, wherein the first and second material layers are formed from a material selected from a group consisting of PE-TEOS and a silicon nitride.

20. A method of forming a contact hole in a semiconductor device, comprising the steps of:

(a) forming an interlayer insulation layer over a semiconductor substrate;

(b) forming a photosensitive film over the interlayer insulation layer to selectively expose a portion of the interlayer insulation layer in which a contact hole is to be formed through a pattern hole in the photosensitive film;

(c) forming a first material layer over the photosensitive film;

(d) anisotropically etching the first material layer to form a sidewall spacer on sidewalls of the pattern hole in the photosensitive film; and (e) anisotropically etching the sidewall spacer and the interlayer insulation layer using the photosensitive film as an etching mask to form a contact hole having a curved upper portion through the interlayer insulation layer.

21. The method of forming a contact hole in a semiconductor device according to claim 20, wherein steps (d) and (e) are sequentially performed in the same process chamber.

22. The method of forming a contact hole in a semiconductor device according to claim 20, further comprising the step of:

thinning the interlayer insulation layer before step (b).

23. The method of forming a contact hole in a semiconductor device according to claim 20, further comprising the step of:

planarizing the interlayer insulation layer before step (b).

24. The method of forming a contact hole in a semiconductor device according to claim 1, wherein the interlayer insulation layer and the first material layer are formed from at least one material having the same etching rate with respect to the anisotropic etching performed in step (e).

25. The method of forming a contact hole in a semiconductor device according to claim 24, wherein the interlayer insulation layer is formed from a material selected from the group consisting of BPSG and $O_3$—TEOS.

26. The method of forming a contact hole in a semiconductor device according to claim 25, wherein the material selected is BPSG, and step (a) comprises the substeps of:

depositing a BPSG layer over the semiconductor substrate; and annealing the BPSG layer at a temperature in a range of from 800° to 900° C. in a nitrogen atmosphere.

27. The method of forming a contact hole in a semiconductor device according to claim 24, wherein the first material layer comprises an oxide film.

28. The method of forming a contact hole in a semiconductor device according to claim 20, further comprising the steps of:

(f) forming a barrier metal layer over the structure resulting from step (e); and (g) forming a conductive layer over the structure resulting from step (f).

* * * * *